(12) United States Patent
Murayama

(10) Patent No.: US 6,281,592 B1
(45) Date of Patent: Aug. 28, 2001

(54) PACKAGE STRUCTURE FOR SEMICONDUCTOR CHIP

(75) Inventor: Kei Murayama, Nagano (JP)

(73) Assignee: Shinko Electric Industries Co., Ltd., Nagano (JP)

(*) Notice: Subject to any disclaimer, the term of this patent is extended or adjusted under 35 U.S.C. 154(b) by 0 days.

(21) Appl. No.: 09/262,057

(22) Filed: Mar. 4, 1999

(30) Foreign Application Priority Data

Mar. 9, 1998 (JP) .................................................. 10-076525

(51) Int. Cl.[7] .................................................. H01L 23/28
(52) U.S. Cl. .................... 257/796; 257/778; 257/780; 257/691; 257/717; 257/720; 257/795
(58) Field of Search .................................... 257/796, 778, 257/691, 738, 717, 720, 706, 711, 780, 795

(56) References Cited

U.S. PATENT DOCUMENTS

| | | | |
|---|---|---|---|
| 5,574,630 | * 11/1996 | Kresge et al. | 361/792 |
| 5,639,989 | * 6/1997 | Higgins | 174/35 |
| 5,900,675 | * 5/1999 | Appelt et al. | 257/778 |
| 5,982,630 | * 11/1999 | Bhatia | 361/767 |
| 6,008,536 | * 12/1999 | Mertol | 257/704 |

* cited by examiner

*Primary Examiner*—Tom Thomas
*Assistant Examiner*—Luan Thai
(74) *Attorney, Agent, or Firm*—Pennie & Edmonds LLP

(57) ABSTRACT

A package structure for a semiconductor chip, comprising: a resin substrate having pads formed thereon, a semiconductor chip having electrodes connected to the pads through bumps, an underfiller filling a space between the semiconductor chip and the resin substrate and bonding the semiconductor chip to the resin substrate, and a stiffener or an elastomer buried in the resin substrate in a portion underneath the semiconductor chip to mitigate or absorb a thermal stress acting between the semiconductor chip, the underfiller and the resin substrate, thereby preventing upward depression of the lower surface of the substrate in a portion underneath the semiconductor chip or preventing fracture of the semiconductor chip.

12 Claims, 7 Drawing Sheets

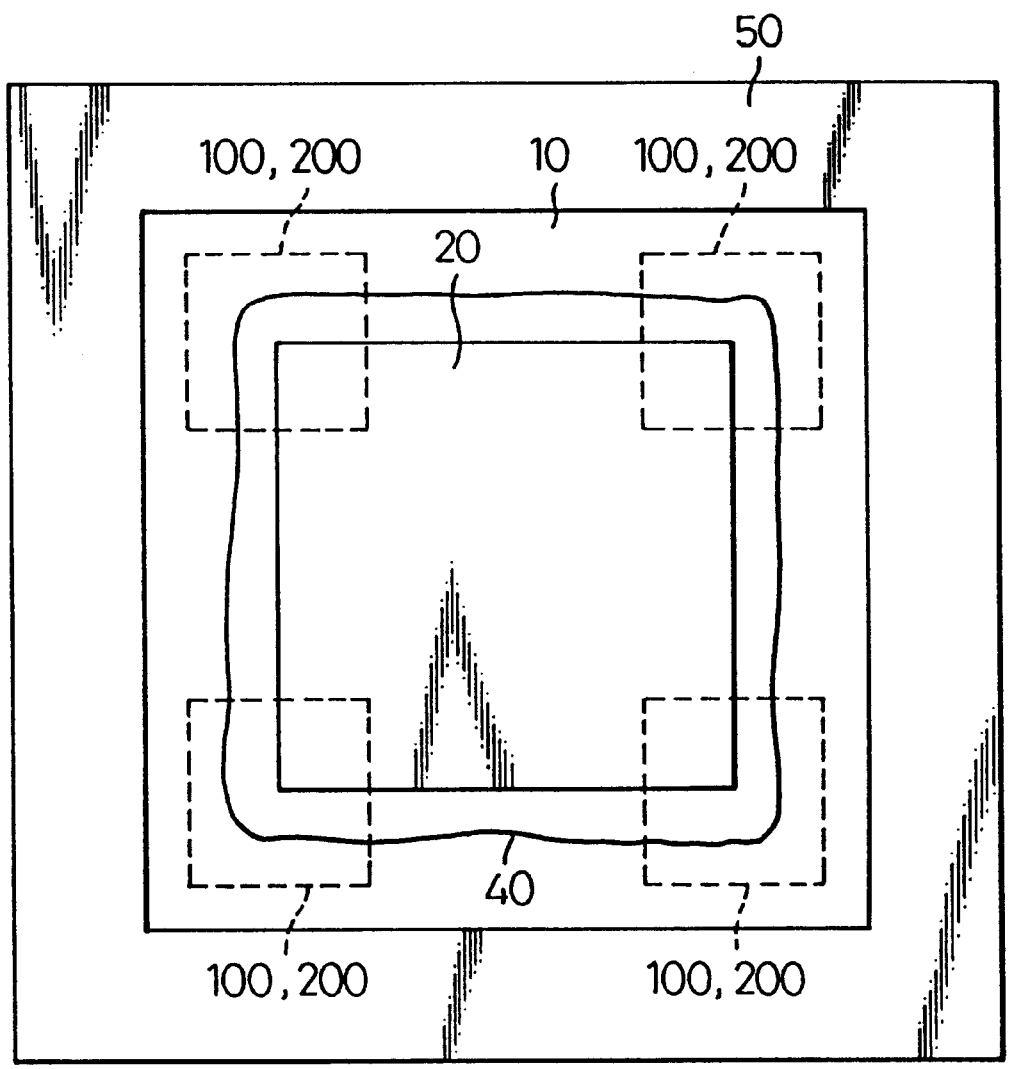

PACKAGE STRUCTURE FOR SEMICONDUCTOR CHIP

BACKGROUND OF THE INVENTION

1. Field of the Invention

The present invention relates to a package structure for a semiconductor chip, including a substrate on which a semiconductor chip is mounted via an underfiller filling between the substrate and the chip.

2. Description of the Related Art

FIGS. 11 and 12 show a known package structure of a semiconductor chip.

A substrate 10 has pads 12 formed thereon and a semiconductor chip 20 has electrodes connected by soldering etc. to the pads 12 through bumps 30 of solder or the like. An underfiller 40 of a cured resin fills a space between the semiconductor chip 20 and the underlying substrate 10 and also bonds the semiconductor chip 20 and the substrate 10. The substrate 10 is formed of epoxy or an other resin having a low permittivity and has circuit wiring (not shown) formed thereon and designed for transmitting high frequency signals without significant loss.

When a thermal stress is generated by a difference between thermal expansion coefficients of the semiconductor chip 20, typically of silicon, and the substrate 10, of resin, and acts between the chip 20 and the substrate 10, the underfiller 40 bonding the chip 20 and the substrate 10 prevents separation between the pads 12 of the substrate 10 and the electrodes of the chip 20, in which the electrodes are connected to the pads 12 through the bumps 30, to ensure good electrical connection between the semiconductor chip 20 and the pads 12.

The underfiller 40 consists of a resin containing a small amount of filler agents such as silicone and having good fluidity, because a space between the semiconductor chip 20 and the substrate can be as small as 80 to 100 $\mu$m and a resin to be filled in the space must have a low viscosity, i.e., a high fluidity.

However, an underfiller 40 formed by curing a resin containing a small amount of filler agents and having a high fluidity has a thermal expansion coefficient greater than that of the semiconductor chip 20 or the resin substrate 10.

For example, a semiconductor chip 20 of silicon has a thermal expansion coefficient of 3.4 ppm/° C. and a substrate 10 of an FR-4 resin has a thermal expansion coefficient of 15 ppm/° C., whereas the above-mentioned underfiller 40 has a thermal expansion coefficient of 23 ppm/° C.

When the semiconductor chip 20, the underfiller 40 and the substrate 10 are subject to heat generated by the semiconductor chip 20 etc., the differencs between thermal expansion coefficients of these three members generates thermal stress between these three members to cause distortion of the substrate 10 such that upward depression in the form of an arc etc. occurs in the lower surface of the substrate 10 in a portion underneath the semiconductor chip 20, so that electrical connection cannot properly achieved between pads on the depressed lower surface of the semiconductor chip 20 and pads on a separate mother board. The thermal stress acting between the substrate 10 and the underfiller 40 can also cause fracture of the fragile semiconductor chip 20.

In the conventional package structure shown in FIGS. 11 and 12, a rectangular frame 50 of copper or other stiff metal is secured on the substrate 10 to surround the portion of the substrate 10 in which the semiconductor chip 20 is mounted, thereby mitigating thermal stress exerted on the substrate 10.

However, this cannot provide a satisfactory solution to the problems that depression occurs in the lower surface of the substrate 10 in a portion underneath the semiconductor chip 20 or that large stress is exerted on the semiconductor chip 20. This is particularly significant for the case in which a large size semiconductor chip 20 having sides of 10 mm or more is mounted on a thin substrate 10.

SUMMARY OF THE INVENTION

The object of the present invention is to provide an improved package structure of a semiconductor chip, including a resin substrate having pads formed thereon, a semiconductor chip having electrodes connected to the pads through bumps, and an underfiller filling a space between the semiconductor chip and the resin substrate and bonding the semiconductor chip to the resin substrate, in which thermal stress acting between the semiconductor chip, the underfiller and the substrate is either mitigated or absorbed so as to solve the conventional problems that upward depression occurs in the lower surface of the substrate in a portion underneath the semiconductor chip or that the semiconductor chip fractures.

To achieve the object according to the first aspect of the present invention, there is provided a package structure of a semiconductor chip, comprising:

a resin substrate having pads formed thereon, a semiconductor chip having electrodes connected to the pads through bumps, an underfiller filling a space between the semiconductor chip and the resin substrate and bonding the semiconductor chip to the resin substrate, and a stiffener buried in the resin substrate in a portion underneath the semiconductor chip to mitigate a thermal stress acting between the semiconductor chip, the underfiller and the resin substrate.

In the package structure of the first aspect, when heat generated by the semiconductor chip etc. generates thermal stress between the semiconductor chip, the underfiller and the substrate having different thermal expansion coefficients, the stiffener made of a stiff material and buried in the substrate in a portion underneath the semiconductor chip mitigates the thermal stress acting between the semiconductor chip and the underfiller and prevents upward depression of the lower surface of the substrate in a portion underneath the semiconductor chip or prevents fracture of the semiconductor chip.

In a preferred embodiment, the stiffener has a thermal expansion coefficient smaller than that of the substrate so that the substrate in the portion underneath the semiconductor chip apparently has a reduced thermal expansion coefficient, or a thermal expansion coefficient close to that of the semiconductor chip, to reduce the thermal stress acting between the substrate, the underfiller and the semiconductor chip.

In a preferred embodiment, the stiffener is composed of separate segments buried in the substrate in portions underneath corners of the semiconductor chip so that thermal stress concentrated at the chip corners can be efficiently mitigated by the stiffener buried in the substrate in portions underneath the chip corners. It is also advantageous that a circuit wiring can be formed in the substrate in portions other than the substrate portions underneath the chip corners without intersection with the stiffener to avoid electrical short circuit between the circuit wiring and the stiffener.

In a preferred embodiment, the stiffener forms a single frame buried in the substrate in a portion underneath a periphery of the semiconductor chip so that thermal stress concentrated at the chip corners can be efficiently mitigated by the stiffener portions located underneath the chip corners, and at the same time, mitigation of the thermal stress at the chip corners can be substantially effected by dispersion of thermal stress over the adjoining stiffener portions other than the stiffener portions located underneath the chip corners, to further promote mitigation of thermal stress concentrated at the chip corners by dispersing the thermal stress entirely over the stiffener.

In a preferred embodiment, the stiffener forms a broad plate buried in the substrate in a portion underneath the whole of the semiconductor chip so that thermal stress concentrated at corners of the semiconductor chip can be efficiently mitigated by the stiffener portions underneath the chip corners, and at the same time, mitigation of the thermal stress at the chip corners can be substantially effected by dispersion of thermal stress broadly over the stiffener portions other than the stiffener portions underneath the chip corners, to still further promote mitigation of thermal stress concentrated at the chip corners.

In a preferred embodiment, the stiffener is electroconductive and forms a ground electrically connected to a ground line formed on the substrate so that the stiffener can be used as a common ground for electrically connecting ground lines formed at several portions of the substrate.

In a preferred embodiment, the elastomer has arc-shaped or linearly chamfered corners.

According to the second aspect of the present invention, there is also provided a package structure of a semiconductor chip, comprising:

a resin substrate having pads formed thereon, a semiconductor chip having electrodes connected to the pads through bumps, an underfiller filling a space between the semiconductor chip and the resin substrate and bonding the semiconductor chip to the resin substrate, and an elastomer buried in the resin substrate in a portion underneath the semiconductor chip to absorb a thermal stress acting between the semiconductor chip, the underfiller and the resin substrate.

In the package structure of the second aspect, when heat generated by the semiconductor chip etc. generates thermal stress between the semiconductor chip, the underfiller and the substrate having different thermal expansion coefficients, the elastomer having a significant flexibility and buried in the substrate in a portion underneath the semiconductor chip absorbs the thermal stress acting between the semiconductor chip and the underfiller and prevents upward depression of the lower surface of the substrate in a portion underneath the semiconductor chip or prevents fracture of the semiconductor chip.

In a preferred embodiment, the elastomer is composed of separate segments buried in the substrate in portions underneath corners of the semiconductor chip so that thermal stress concentrated at the chip corners can be efficiently absorbed by the elastomer segments buried in the substrate in portions underneath the chip corners. It is also advantageous that circuit wiring can be formed in the substrate in portions other than the substrate portions underneath the chip corners without obstruction by the elastomer.

In a preferred embodiment, the elastomer forms a single frame buried in the substrate in a portion underneath a periphery of the semiconductor chip so that thermal stress concentrated at the chip corners can be efficiently absorbed by the elastomer portions located underneath the chip corners, and at the same time, absorption of the thermal stress at the chip corners can be substantially effected by dispersion of thermal stress over the adjoining elastomer portions other than the elastomer portions underneath the chip corners, to further promote mitigation of thermal stress concentrated at the chip corners by dispersing the thermal stress entirely over the elastomer.

In a preferred embodiment, the elastomer forms a broad plate buried in the substrate in a portion underneath the entire of the semiconductor chip so that thermal stress concentrated at corners of the semiconductor chip can be efficiently absorbed by the elastomer portions underneath the chip corners, and at the same time, absorption of the thermal stress at the chip corners can be substantially effected by dispersion of thermal stress broadly over the elastomer portions other than the elastomer portions underneath the chip corners, to still further promote absorption of thermal stress concentrated at the chip corners.

In a preferred embodiment according to the first or second aspect, a stiffener or an elastomer has arc-shaped or linearly chamfered corners to prevent stress concentration from occurring at the corners of the stiffener or the elastomer so that either mitigation of thermal by the stiffener or absorption of thermal stress by the elastomer is efficiently effected by dispersion of thermal stress entirely over the stiffener or the elastomer.

BRIEF DESCRIPTION OF THE DRAWINGS

FIG. 2 is a plan view showing the package structure shown in FIG. 1A;

DESCRIPTION OF THE PREFERRED EMBODIMENTS

EXAMPLE 1

Figure 1A:
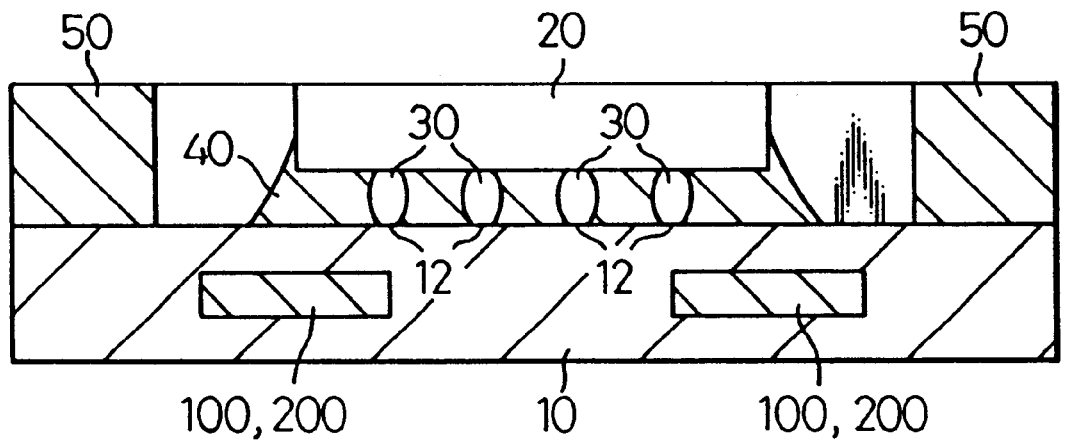
FIGS. 1A and 1B are cross-sectional views showing a package structure according to the present invention having a stiffener or an elastomer composed of segments buried in a substrate in portions underneath the corners of a semiconductor chip, with or without a rectangular frame of copper or other stiff metal secured on a resin substrate, respectively.
Figure 1B:
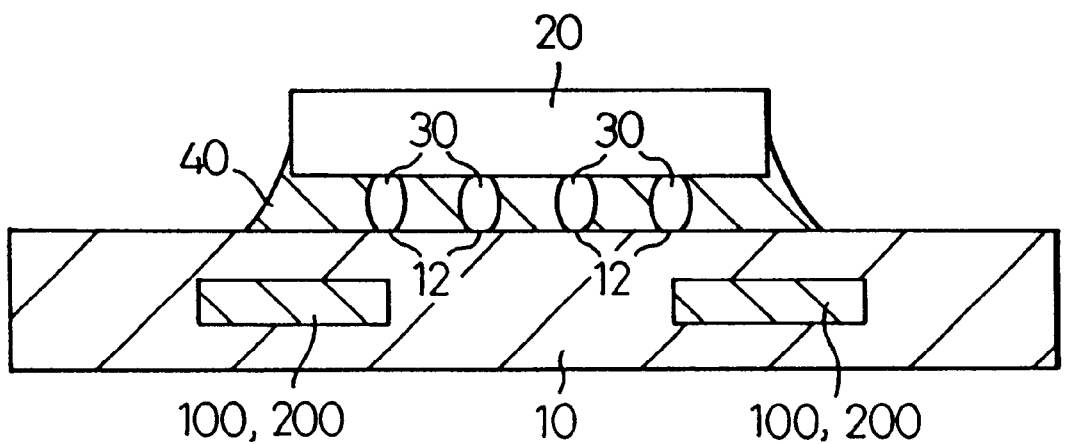

FIGS. 1A and 1B are cross-sectional views showing a package structure according to the present invention, with or without a rectangular frame of copper or other stiff metal secured on a resin substrate, respectively. FIG. 2 is a plan view showing the package structure shown in FIG. 1A.

Figure 11:
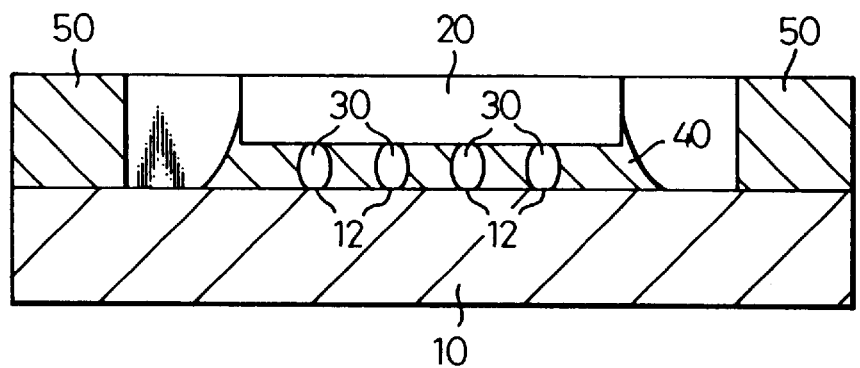
FIG. 11 is a cross-sectional view showing a conventional package structure.
Figure 12:
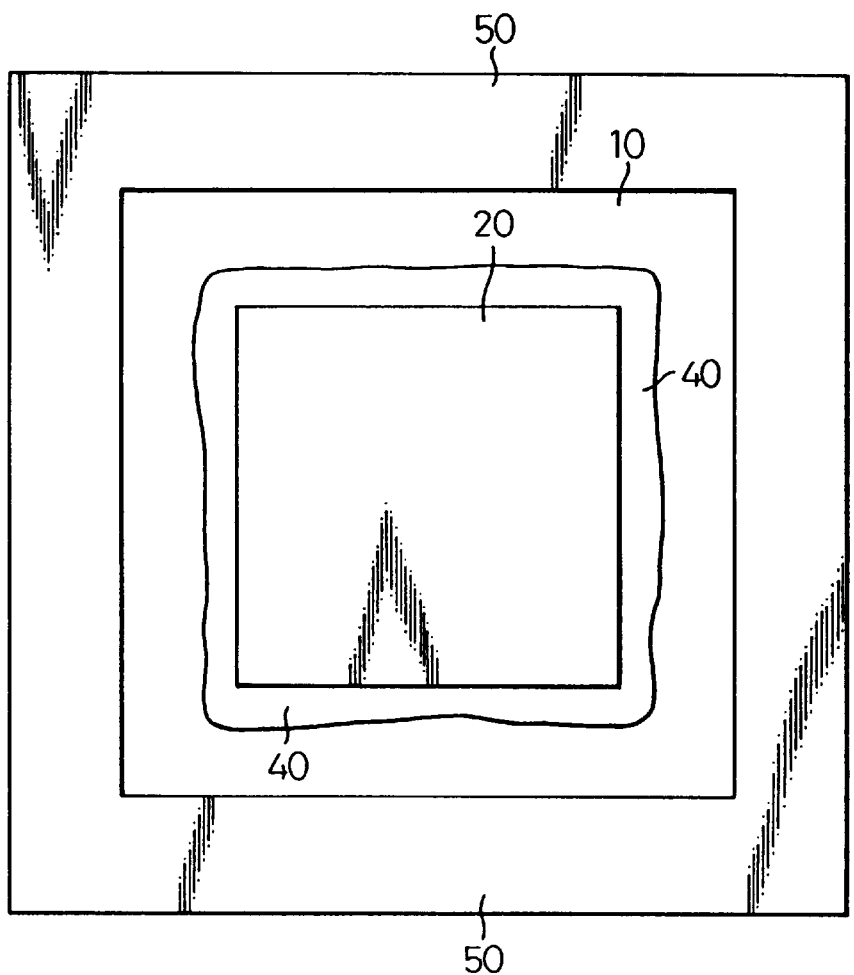
FIG. 12 is a plan view showing the conventional package structure of FIG. 11.

The shown package structure is different from the aforementioned conventional package structure shown in FIGS. 11 and 12 in the following features.

According to the first aspect of the present invention, the package structure shown in FIGS. 1A or 1B and 2 includes a stiffener 100 composed of separate rectangular segments of a stiff material and buried in a substrate 10 in portions underneath four corners of a rectangular semiconductor chip 20. The stiffener 100 may be made of Ni, Cu, Al or other metals or alumina or an other ceramic, having a Young's modulus (or hardness) greater than that of the substrate made of FR-4, BT, polyimide or other resins. The stiffener 100 stiffens the substrate to prevent distortion of the substrate due to thermal stress.

The stiffener is preferably made of a material having a thermal expansion coefficient smaller than that of the substrate made of FR-4, BT, polyimide or other resins, so that the substrate in the portions in which the stiffener segments 100 are buried has an apparently reduced thermal expansion coefficient close to that of the semiconductor chip 20, thereby efficiently reducing the thermal stress acting between the substrate 10, the underfiller 40 and the semiconductor chip 20.

Such materials having a small thermal expansion coefficient typically include alumina ceramics, covar alloy (54Fe—29Ni—17Co) and 10Cu—90W alloy (copper impregnated in a porous tungsten base).

According to the second aspect of the present invention, the package structure shown in FIGS. 1A or 1B and 2 includes an elastomer 200 composed of separate rectangular segments of a flexible material buried in a substrate 10 in portions underneath four corners of a rectangular semiconductor chip 20. The elastomer 200 may be made of silicone resin.

Table 1 exemplifies typical materials used for a substrate, a stiffener and an elastomer according to the present invention.

TABLE 1

|  | Material | E (GPa) | TEC (ppm/° C.) |
|---|---|---|---|
| Substrate | FR-4 | 18.6 | 15.0 |
|  | BT | 20.0 | 16.0 |
|  | Polyimide | 8.8 | 12.0 |

TABLE 1-continued

|  | Material | E (GPa) | TEC (ppm/° C.) |
|---|---|---|---|
| Stiffener | Ni | 206.9 | 15.2 |
|  | Cu | 117.7 | 17.2 |
|  | Al | 225.0 | 24.0 |
|  | Alumina | 307.9 | 7.0 |
|  | Covar | 137 | 3.7 |
|  | 10Cu-90W | 333.4 | 6.8 |
| Elastomer | Silicone | 0.0061 | 200 |

[Note]
E: Young's modulus
TEC: Thermal exapsnion coefficient
FR-4: glass-epoxy substrate
BT: bis maleimide triazine In the package structure shown in FIGS. 1A, 1B and 2, thermal stress generated between the semiconductor chip 20, the underfiller 40 and the substrate 10 is either mitigated by the stiffener 100 of a stiff material buried in the substrate 10 in a portion underneath the semiconductor chip 20, or absorbed by the elastomer 200 of a flexible material buried in the substrate 10 in a portion underneath the semiconductor chip 20 and, at the same time, thermal stress concentrated at the corners of the semiconductor chip 20 is either efficiently mitigated by the stiffener segments 100 buried in the substrate 10 in the portions underneath the chip corners, or efficiently absorbed by the elastomer segments 200 buried in the substrate 10 in the portions underneath the chip corners, thereby preventing upward depression of the substrate 10 in the portion underneath the semiconductor chip 20 or preventing fracture of the semiconductor chip 20.

It is also advantageous in the first aspect that circuit wiring can be formed in the substrate 10 in portions other than the substrate portions underneath the corners of the semiconductor chip 20 without intersection with the stiffener 100 to avoid electrical short circuit between the circuit wiring and the stiffener 100 of a metal or other stiff materials.

It is also advantageous in the second aspect that circuit wiring can be formed in the substrate 10 in portions other than the substrate portions underneath the corners of the semiconductor chip 20 without obstruction by the elastomer 200.

Figure 3:
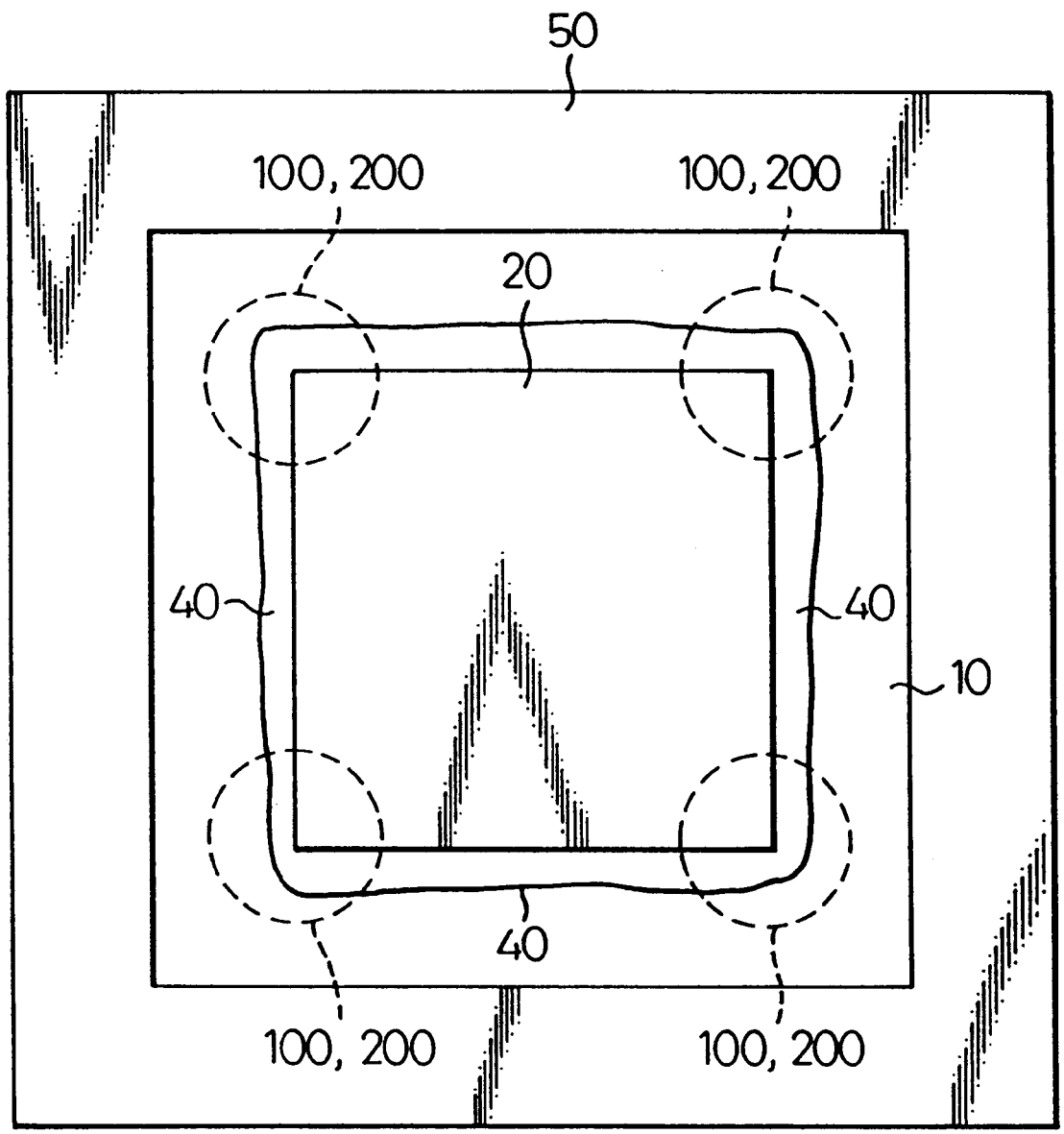
FIG. 3 is a plan view showing a package structure according to the present invention having a stiffener or an elastomer composed of segments having arc-shaped corners, buried in a substrate in portions underneath the corners of a semiconductor chip.

As shown in FIG. 3, a stiffener 100 or an elastomer 200 preferably has arc-shaped or linearly chamfered corners (arc-shaped corners are shown). This either advantageously facilitates mitigation of thermal stress because thermal stress is not concentrated to the corners of the stiffener 100 but is dispersed entirely over the stiffener 100, or advantageously further facilitates absorption of thermal stress because thermal stress is not concentrated to the corners of the elastomer 200 but is dispersed entirely over the elastomer 200.

Figure 4:
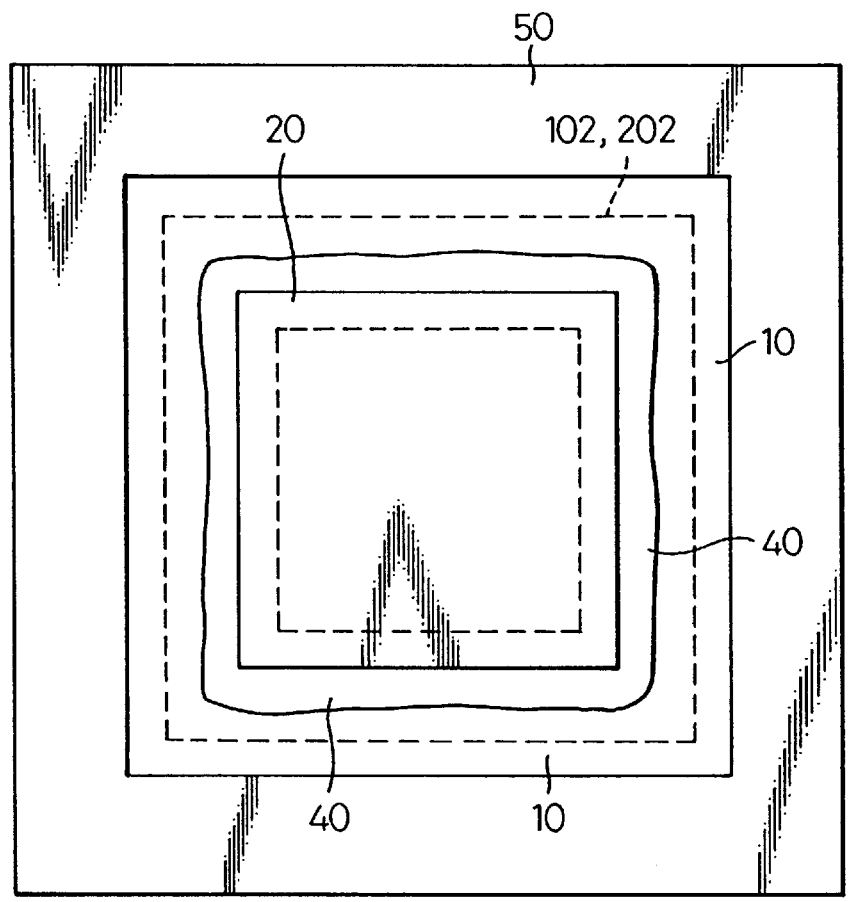
FIG. 4 is a plan view showing a package structure according to the present invention having a stiffener or an elastomer forming a single frame buried in a substrate in a portion underneath the periphery of a semiconductor chip.

FIG. 4 shows a package structure according to a preferred embodiment of the present invention, in which a stiffener 102 or an elastomer 202 forms a single frame buried in the resin substrate 10 in a portion underneath a periphery of the semiconductor chip 20.

In this preferred embodiment, thermal stress concentrated at the chip corners can be efficiently mitigated by the portions of stiffener 102 located underneath the corners of the semiconductor chip 20 or absorbed by the portions of elastomer 202 located underneath the semiconductor chip 20, and at the same time, either mitigation of the thermal stress at the corners of the semiconductor chip 20 can be substantially effected by dispersion of the thermal stress over the adjoining portions of stiffener 102 other than the stiffener portions located underneath the chip corners, or absorption of the thermal stress at the corners of the semiconductor 20 can be substantially effected by dispersion of thermal stress over the adjoining portions of elastomer 202 other than the elastomer portions underneath the chip corners, to further promote mitigation of thermal stress concentrated at the chip corners, or further promote absorption of thermal stress concentrated at the chip corners.

Figure 5:
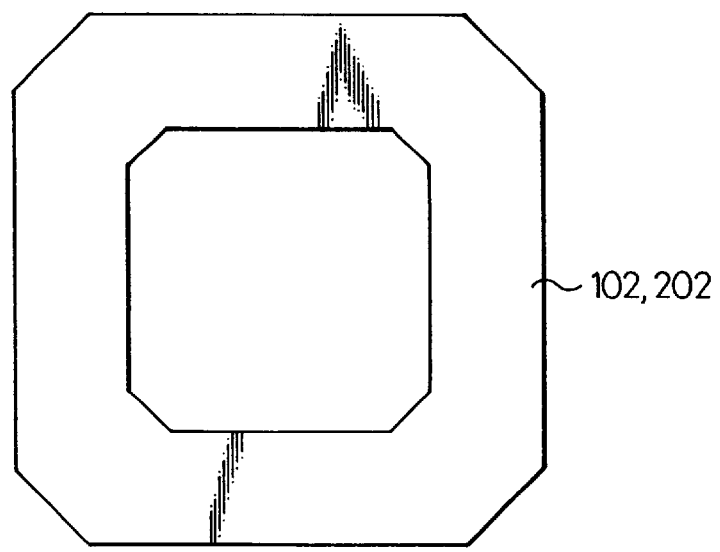
FIG. 5 is a plan view showing a stiffener or an elastomer according to the present invention with the inner and outer corners being linearly chamfered.

As shown in FIG. 5, the stiffener 102 or the elastomer 202 in the form of a single frame preferably has inner and outer corners which are arc-shaped or linearly chamfered (linearly chamfered corners are shown) so that thermal stress generated between the chip 20, the underfiller 40 and the substrate 10 is prevented from being concentrated to the corners of the stiffener 102 or the elastomer 202, thereby efficiently mitigating or absorbing the thermal stress by dispersing it entirely over the stiffener or the elastomer.

Figure 6:
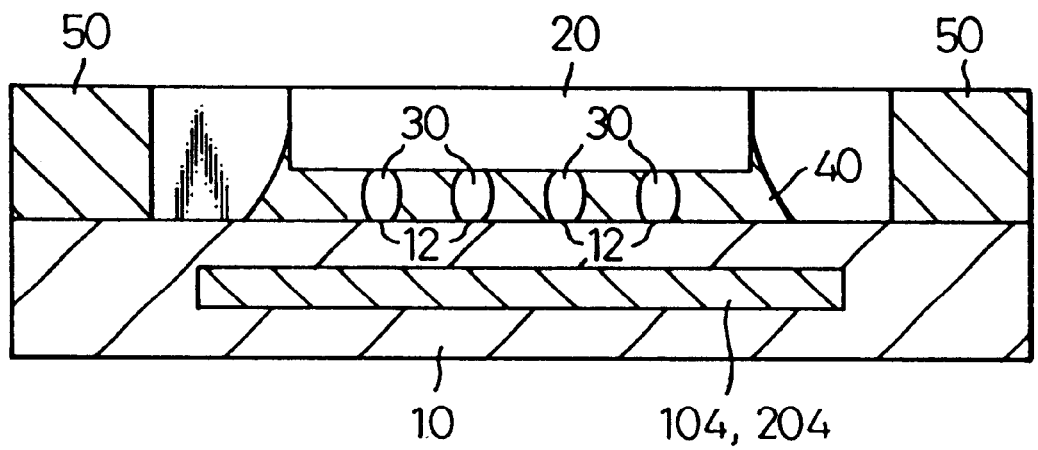
FIG. 6 is a plan view showing a package structure according to the present invention having a stiffener or an elastomer forming a broad plate buried in a substrate in a portion underneath the entire of a semiconductor chip.
Figure 7:
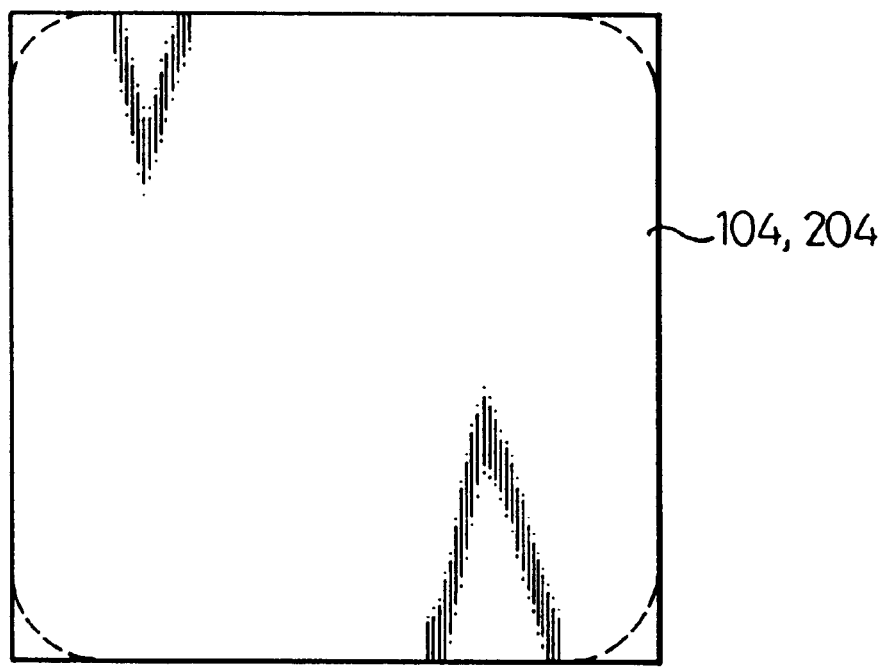
FIG. 7 is a plan view showing a stiffener or an elastomer according to the present invention having arc-shaped corners.

FIGS. 6 and 7 show a package structure according to a preferred embodiment of the present invention, in which a stiffener 104 or an elastomer 204 forms a broad plate buried in the substrate 10 in a portion underneath the entire of the semiconductor chip 20.

In this preferred embodiment, thermal stress concentrated at corners of the semiconductor chip 20 can be efficiently mitigated by the portions of stiffener 104 or absorbed by the portions of elastomer 204 located underneath the corners of the semiconductor chip 20, and at the same time, mitigation of the thermal stress at the chip corners can be substantially effected by dispersion of thermal stress over the broader stiffener portions other than the stiffener portions located underneath the chip corners or absorption of the thermal stress at the chip corners can be substantially effected by dispersion of thermal stress over the broader elastomer portions other than the elastomer portions located underneath the chip corners, to still further promote mitigation or absorption of thermal stress concentrated at the chip corners.

As shown in FIG. 7, the stiffener 104 or the elastomer 204 in the form of a broad plate preferably has corners which are arc-shaped or linearly chamfered (arc-shaped corners are shown) so that thermal stress generated between the chip 20, the underfiller 40 and the substrate 10 is prevented from being concentrated to the corners of the stiffener 102 or the elastomer 202, thereby efficiently mitigating or absorbing the thermal stress by dispersing it entirely over the stiffener or the elastomer.

The stiffener 100, 102, 104 or the elastomer 200, 202, 204 is not necessarily positioned in the middle of the thickness of the substrate 10 but may be arranged as follows.

Figure 8:
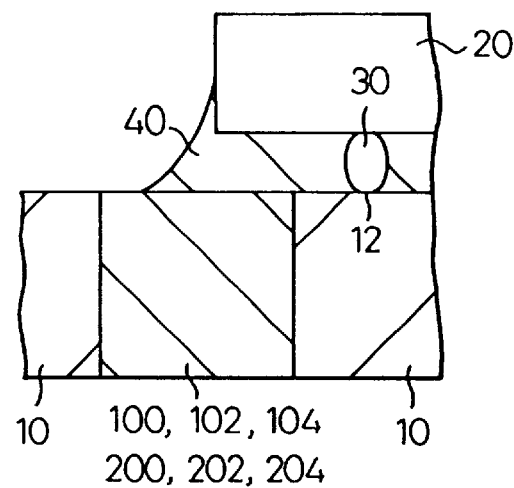
FIG. 8 is a partial cross-sectional view showing a package structure according to the present invention having a stiffener or an elastomer as thick as a substrate and extending through a substrate, with the upper and lower surfaces being exposed from the upper and lower surfaces of the substrate, respectively.
Figure 9:
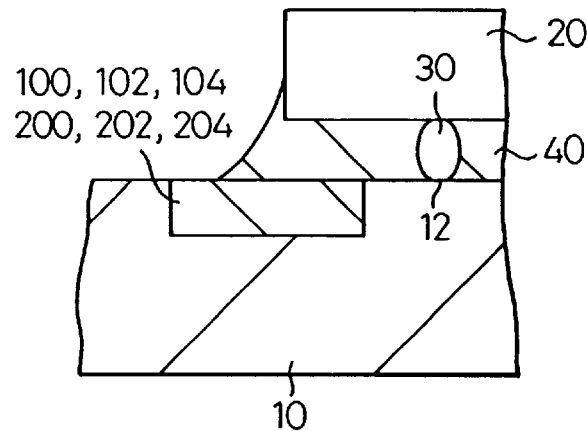
FIG. 9 is a partial cross-sectional view showing a package structure according to the present invention, in which a stiffener or an elastomer thinner than a substrate is buried in the substrate, with only the upper surface being exposed from the upper surface of the substrate.
Figure 10:
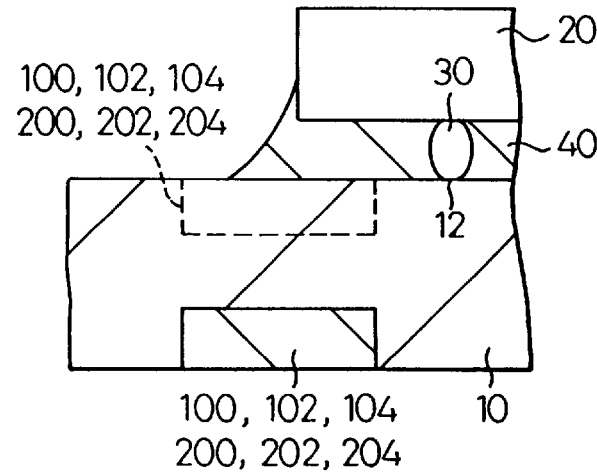
FIG. 10 is a partial cross-sectional view showing a package structure according to the present invention having a stiffener or an elastomer thinner than a substrate and with only the lower surface being exposed from the lower surface of the substrate.

FIG. 8 shows a modified embodiment, in which a stiffener 100, 102, 104 or an elastomer 200, 202, 204 is as thick as a substrate and extends through a substrate 10, with the upper and lower surfaces being exposed from the upper and lower surfaces of the substrate 10, respectively. FIG. 9 shows another modification, in which a stiffener 100, 102, 104 or an elastomer 200, 202, 204 is thinner than a substrate 10 and is buried in the substrate 10, with only the upper surface being exposed from the upper surface of the substrate 10. FIG. 10 shows still further modification, in which a stiffener 100, 102, 104 or an elastomer 200, 202, 204 is thinner than a substrate 10, with only the lower surface being exposed from the lower surface of the substrate 10.

In these modification, the stiffener 100, 102, 104 or the elastomer 200, 202, 204 also provides mitigation or absorption of thermal stress acting between the semiconductor chip 20, the underfiller 40 and the substrate 10.

In another preferred embodiment according to the first aspect of the present invention, a stiffener 100, 102, 104 is made of Ni, Cu or other electroconductive material and forms a ground electrically connected to a ground line formed on a substrate 10 so that the stiffener 100, 102, 104 can be advantageously used as a common ground for electrically connecting ground lines formed at several portions of the substrate 10.

As described herein, the present invention provides an improved package structure for a semiconductor chip, including a resin substrate having pads formed thereon, a semiconductor chip having electrodes connected to the pads through bumps, and an underfiller filling a space between the semiconductor chip and the resin substrate and bonding the semiconductor chip to the resin substrate, in which thermal stress acting between the semiconductor chip, the underfiller and the substrate is either mitigated or absorbed so as to solve the conventional problems that upward depression occurs in the lower surface of the substrate in a portion underneath the semiconductor chip or that the semiconductor chip fractures.

What is claimed is:

1. A semiconductor package structure comprising:

a resin substrate having pads formed thereon;

a semiconductor chip having electrodes connected to the pads through bumps;

an underfiller filling a space between the semiconductor chip and the resin substrate and bonding the semiconductor chip to the resin substrate; and a stiffener buried in the resin substrate in a portion underneath the semiconductor chip, the stiffener being positioned in a location and having a shape and size sufficient to mitigate a thermal stress acting between the semiconductor chip, the underfiller and the resin substrate, and wherein both an upper surface and a lower surface of the stiffener are exposed relative to the resin substrate.

2. A package structure according to claim 1, wherein the stiffener has a thermal expansion coefficient smaller than that of the resin substrate.

3. A package structure according to claim 1, wherein the stiffener is composed of separate segments buried in the resin substrate in portions underneath corners of the semiconductor chip.

4. A package structure according to claim 1, wherein the stiffener forms a single frame buried in the resin substrate in a portion underneath a periphery of the semiconductor chip.

5. A package structure according to claim 1, wherein the stiffener forms a broad plate buried in the resin substrate in a portion underneath the entire of the semiconductor chip.

6. A package structure according to claim 1, wherein the stiffener is electroconductive and forms a ground electrically connected to a ground line formed on the resin substrate.

7. A package structure according to claim 1, wherein the stiffener has arc-shaped or linearly chamfered corners.

8. A semiconductor package structure comprising:

a resin substrate having pads formed thereon;

a semiconductor chip having electrodes connected to the pads through bumps;

an underfiller filling a space between the semiconductor chip and the resin substrate and bonding the semiconductor chip to the resin substrate; and an elastomer buried in the resin substrate in a portion underneath the semiconductor chip, the elastomer being positioned in a location and having a shape and size sufficient to absorb a thermal stress acting between the semiconductor chip, the underfiller and the resin substrate, wherein both an upper surface and a lower surface of the elastomer are exposed relative to the resin substrate.

9. A package structure according to claim 8, wherein the elastomer is composed of separate segments buried in the resin substrate in portions underneath corners of the semiconductor chip.

10. A package structure according to claim 8, wherein the elastomer forms a single frame buried in the resin substrate in a portion underneath a periphery of the semiconductor chip.

11. A package structure according to claim 8, wherein the elastomer forms a broad plate buried in the resin substrate in a portion underneath the entire semiconductor chip.

12. A package structure according to claim 8, wherein the elastomer has arc-shaped or linearly chamfered corners.

* * * * *